(12) United States Patent
Lv et al.

(10) Patent No.: US 9,872,411 B2
(45) Date of Patent: Jan. 16, 2018

(54) REMOTE TERMINAL UNIT (RTU) SUPPORTING ELEVATED OPERATING TEMPERATURE AND REDUCED POWER CONSUMPTION

(71) Applicant: Honeywell International Inc., Morristown, NJ (US)

(72) Inventors: Jie Lv, Shanghai (CN); Lei Zou, Shanghai (CN); Zhi Yang, Shanghai (CN)

(73) Assignee: Honeywell International Inc., Morris Plains, NJ (US)

( * ) Notice: Subject to any disclaimer, the term of this patent is extended or adjusted under 35 U.S.C. 154(b) by 65 days.

(21) Appl. No.: 14/979,068

(22) Filed: Dec. 22, 2015

(65) Prior Publication Data

US 2016/0249483 A1     Aug. 25, 2016

Related U.S. Application Data

(63) Continuation of application No. PCT/CN2015/073240, filed on Feb. 23, 2015.

(51) Int. Cl.
*H05K 7/14* (2006.01)
*H05K 7/20* (2006.01)

(52) U.S. Cl.
CPC ......... *H05K 7/1468* (2013.01); *H05K 7/1479* (2013.01); *H05K 7/20454* (2013.01)

(58) Field of Classification Search
CPC .... Y02B 10/30; Y02B 10/70; Y02B 60/1282; H01L 2924/14; H01L 2924/00014;
(Continued)

(56) References Cited

U.S. PATENT DOCUMENTS 6,597,569 B1    7/2003   Unrein
8,072,098 B2   12/2011   Elias et al.
(Continued)

FOREIGN PATENT DOCUMENTS

CN         1652245      8/2005
CN       201548867      8/2010
(Continued)

OTHER PUBLICATIONS

McLaughlin et al., U.S. Patent Application "Remote Terminal Unit (RTU) With Wireless Diversity and Related Method" U.S. Appl. No. 14/035,557, filed Sep. 24, 2013. 33 pgs.
(Continued)

*Primary Examiner* — Adam B Dravininkas

(57) ABSTRACT

An apparatus includes a remote terminal unit (RTU) having a housing, where at least a portion of the housing includes a shell of thermally-conductive material. The RTU also includes at least one circuit board assembly having at least one processing device configured to communicate with one or more industrial control and automation field devices via one or more input/output (I/O) channels. The at least one circuit board assembly is positioned within the shell. The RTU further includes a heat sink configured to remove thermal energy from the at least one processing device. In addition, the RTU includes a thermal pad configured to receive the thermal energy from the heat sink and to provide the thermal energy to the shell.

20 Claims, 11 Drawing Sheets

(58) Field of Classification Search
CPC . H01L 2224/73253; H01L 2225/06513; H01L 2225/06582; H01L 23/041; F01B 17/022; H05K 7/005; H05K 7/1439; H05K 7/1457; H05K 7/1459; H05K 7/1468; H05K 7/1479; H05K 7/20454
See application file for complete search history.

(56) References Cited

U.S. PATENT DOCUMENTS

| | | | |
|---|---|---|---|
| 8,392,626 | B2 | 3/2013 | Wormmeester et al. |
| 8,656,065 | B1 | 2/2014 | Gerhart et al. |
| 8,667,091 | B2 | 3/2014 | Almadi et al. |
| 2002/0147503 | A1* | 10/2002 | Osburn, III ........ G05B 19/4183 700/9 |
| 2005/0216107 | A1 | 9/2005 | O'Donnell et al. |
| 2006/0240818 | A1 | 10/2006 | McCoy et al. |
| 2007/0101173 | A1* | 5/2007 | Fung ..................... G06F 1/3209 713/300 |
| 2007/0147015 | A1* | 6/2007 | Andretta .............. H05K 7/1418 361/801 |
| 2008/0031620 | A1* | 2/2008 | Hudgins .............. H04B 10/075 398/9 |
| 2009/0180775 | A1* | 7/2009 | Hudgins ................ H04B 10/40 398/25 |
| 2009/0271558 | A1 | 10/2009 | Wormmeester et al. |
| 2011/0035606 | A1 | 2/2011 | Lovicott et al. |
| 2012/0290735 | A1 | 11/2012 | Johnson et al. |
| 2015/0084747 | A1 | 3/2015 | McLaughlin et al. |
| 2015/0278144 | A1 | 10/2015 | McLaughlin et al. |

FOREIGN PATENT DOCUMENTS

| | | |
|---|---|---|
| CN | 102156514 | 8/2011 |
| CN | 202435772 | 9/2012 |
| CN | 103472813 | 12/2013 |
| CN | 204142882 | 2/2015 |
| EP | 1562198 | 8/2005 |
| JP | 2007527073 | 9/2007 |
| JP | 2013535730 | 9/2013 |
| KR | 20100066815 | 6/2010 |
| KR | 20120135142 | 12/2012 |
| WO | WO 2005/086110 | 9/2005 |
| WO | WO2012/012723 | 1/2012 |
| WO | WO 2015/148106 | 10/2015 |

OTHER PUBLICATIONS

Technical Brief, "25A Right Angle Signal/Power Combo"; SAMTEC Power Strip 25; 2008; 1 page.

Technical Brief, "FCN-RTU Low Power Autonomous Controller Hardware"; STARDOM FCN-RTU; Yokogawa Electric Corporation; Dec. 2008; 13 pages.

Emerson, "ControlWave Micro Process Automation Controller"; Instruction Manual; Emerson Process Management; Jun. 2013; 170 pages.

McLaughlin et al., U.S. Patent Application "Remote Terminal Unit (RTU) With Universal Input/Output (UIO) and Related Method" U.S. Appl. No. 14/228,142, filed Mar. 27, 2014, 53 pgs.

International Search Report and Written Opinion issued for PCT/US2015/043607, dated Oct. 27, 2015, 12 pages.

International Search Report and Written Opinion issued for PCT/CN2015/073240, dated Jun. 29, 2015, 12 pages.

International Search Report and Written Opinion issued for PCT/US2015/019671, dated Jun. 10, 2015, 12 pages.

U.S. Patent Application "Remote Terminal Unit (RTU) Hardware Architecture " U.S. Appl. No. 14/459,557, filed Aug. 14, 2014; 37 pages.

Zhen Wang et al., U.S. Patent Application "Method and Apparatus for Determining Displacement of a Remote Terminal Unit" U.S. Appl. No. 14/742,516, filed Jun. 17, 2015, 24 pgs.

Ke Lou et al., U.S. Patent Application "DNP3 Based Ethernet Port Power Saving for Solar Power Energized RTU System" U.S. Appl. No. 14/745,726, filed Jun. 22, 2015, 30 pages.

Yang et al., U.S. Appl. No. 14/670,328, "Master/Slave Management for Redundant ProcesS Controller Modules", filed Mar. 26, 2015, 25 pgs.

"Dual FET Bus Switch, 2.5-V/3.3-V Low Voltage High-Bandwidth Bus Switch", Texas Instruments, Dec. 2002—Revised Jan. 2011, 25 pgs.

"Dual FET Bus Switch, 2.5-V/3.3-V Low Voltage High-Bandwidth Bus Switch", Texas Instruments, Oct. 2003—Revised Oct. 2009, 14 pgs.

"SN74CB3Q3305 Dual FET Bus Switch, 2.5-V/3.3-V Low Voltage High-Bandwidth Bus Switch", Texas Instruments, Oct. 2003—Revised Nov. 2015, 13 pgs.

International Search Report and Written Opinion issued for PCT/US2015/019671 dated Jun. 10, 2015, 11 pgs.

* cited by examiner

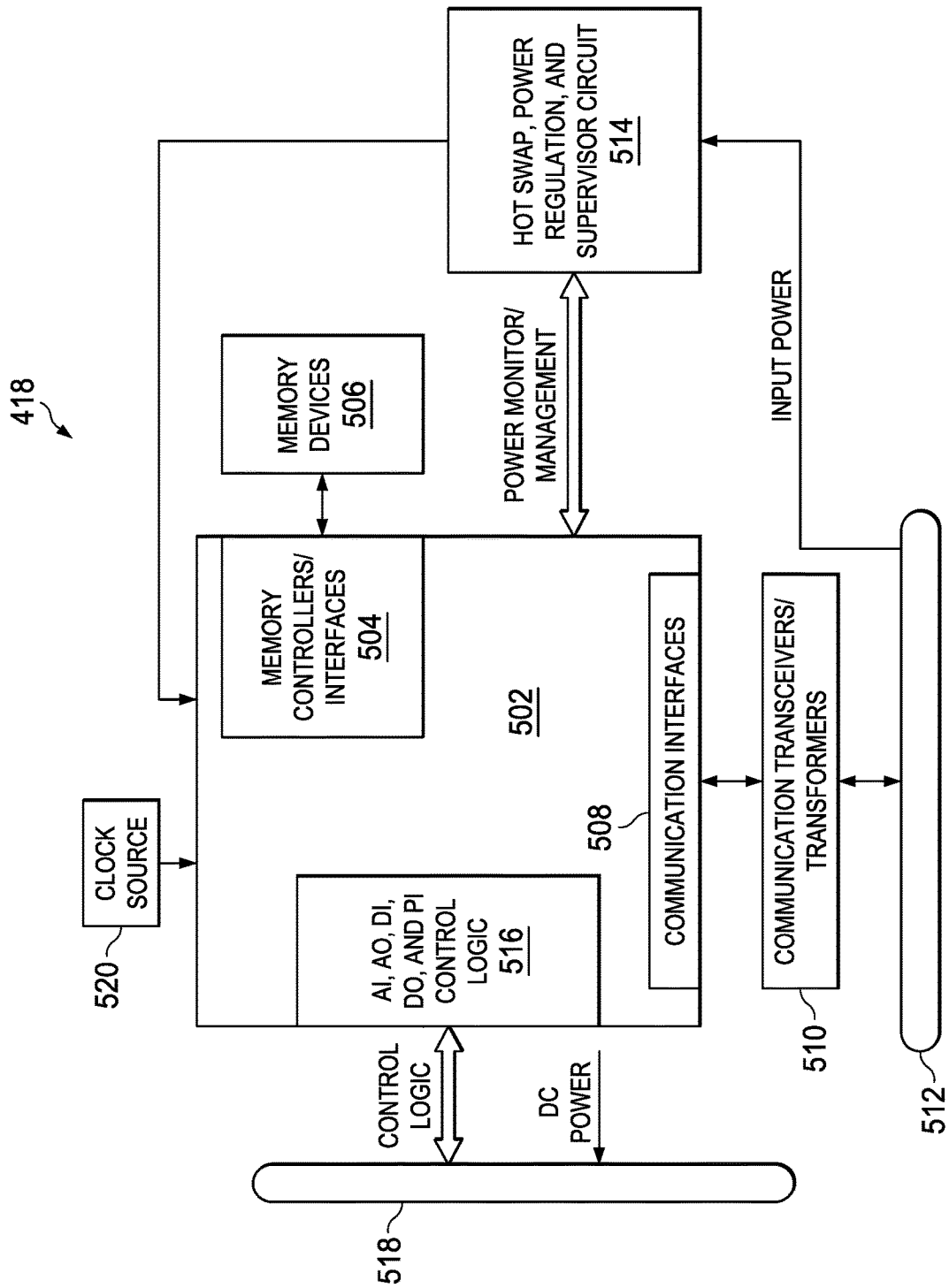

REMOTE TERMINAL UNIT (RTU) SUPPORTING ELEVATED OPERATING TEMPERATURE AND REDUCED POWER CONSUMPTION

CROSS-REFERENCE TO RELATED APPLICATION AND PRIORITY CLAIM

This application is a continuation of International Patent Application No. PCT/CN2015/073240 filed on Feb. 23, 2015. This PCT application is hereby incorporated by reference in its entirety.

TECHNICAL FIELD

This disclosure is generally directed to industrial process control and automation systems. More specifically, this disclosure is directed to a remote terminal unit (RTU) supporting an elevated operating temperature and reduced power consumption.

BACKGROUND

A remote terminal unit (RTU) represents a device or system that provides localized control and data access at a site that is remote from a supervisory control and data acquisition (SCADA) system or other automation system. For example, multiple RTUs can be used at different sites and for different purposes in an oil and gas field. The RTUs can collect data, perform local control using sensors and actuators at different sites (such as wells, pipelines, and compression stations), record historical values, and provide live and historical data to a SCADA system. The SCADA system can execute control logic and alter the operations of actuators at the different sites via the RTUs. The RTUs themselves could also incorporate algorithms for data analytics.

SUMMARY

This disclosure provides a remote terminal unit (RTU) supporting an elevated operating temperature and reduced power consumption.

In a first embodiment, an apparatus includes a remote terminal unit (RTU) having a housing, where at least a portion of the housing includes a shell of thermally-conductive material. The RTU also includes at least one circuit board assembly having at least one processing device configured to communicate with one or more industrial control and automation field devices via one or more input/output (I/O) channels. The at least one circuit board assembly is positioned within the shell. The RTU further includes a heat sink configured to remove thermal energy from the at least one processing device and a thermal pad configured to receive the thermal energy from the heat sink and to provide the thermal energy to the shell.

In a second embodiment, a system includes one or more industrial control and automation field devices and an RTU. The RTU includes a housing, where at least a portion of the housing includes a shell of thermally-conductive material. The RTU also includes at least one circuit board assembly having at least one processing device configured to communicate with the one or more field devices via one or more I/O channels. The at least one circuit board assembly is positioned within the shell. The RTU further includes a heat sink configured to remove thermal energy from the at least one processing device and a thermal pad configured to receive the thermal energy from the heat sink and to provide the thermal energy to the shell.

In a third embodiment, a method includes operating at least one processing device on at least one circuit board assembly of an RTU. The at least one circuit board assembly is positioned within a housing of the RTU. At least a portion of the housing includes a shell of thermally-conductive material. The method also includes, using the at least one processing device, communicating with one or more industrial control and automation field devices via one or more I/O channels. The method includes removing thermal energy from the at least one processing device using a heat sink, receiving the thermal energy from the heat sink at a thermal pad, and providing the thermal energy from the thermal pad to the shell.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which:

FIGS. 4A through 8B illustrate an example mechanical design for an RTU according to this disclosure;

DETAILED DESCRIPTION

FIGS. 1 through 11, discussed below, and the various examples used to describe the principles of the present invention in this patent document are by way of illustration only and should not be construed in any way to limit the scope of the invention. Those skilled in the art will understand that the principles of the present invention may be implemented in any suitable manner and in any type of suitably arranged device or system.

Figure 1:
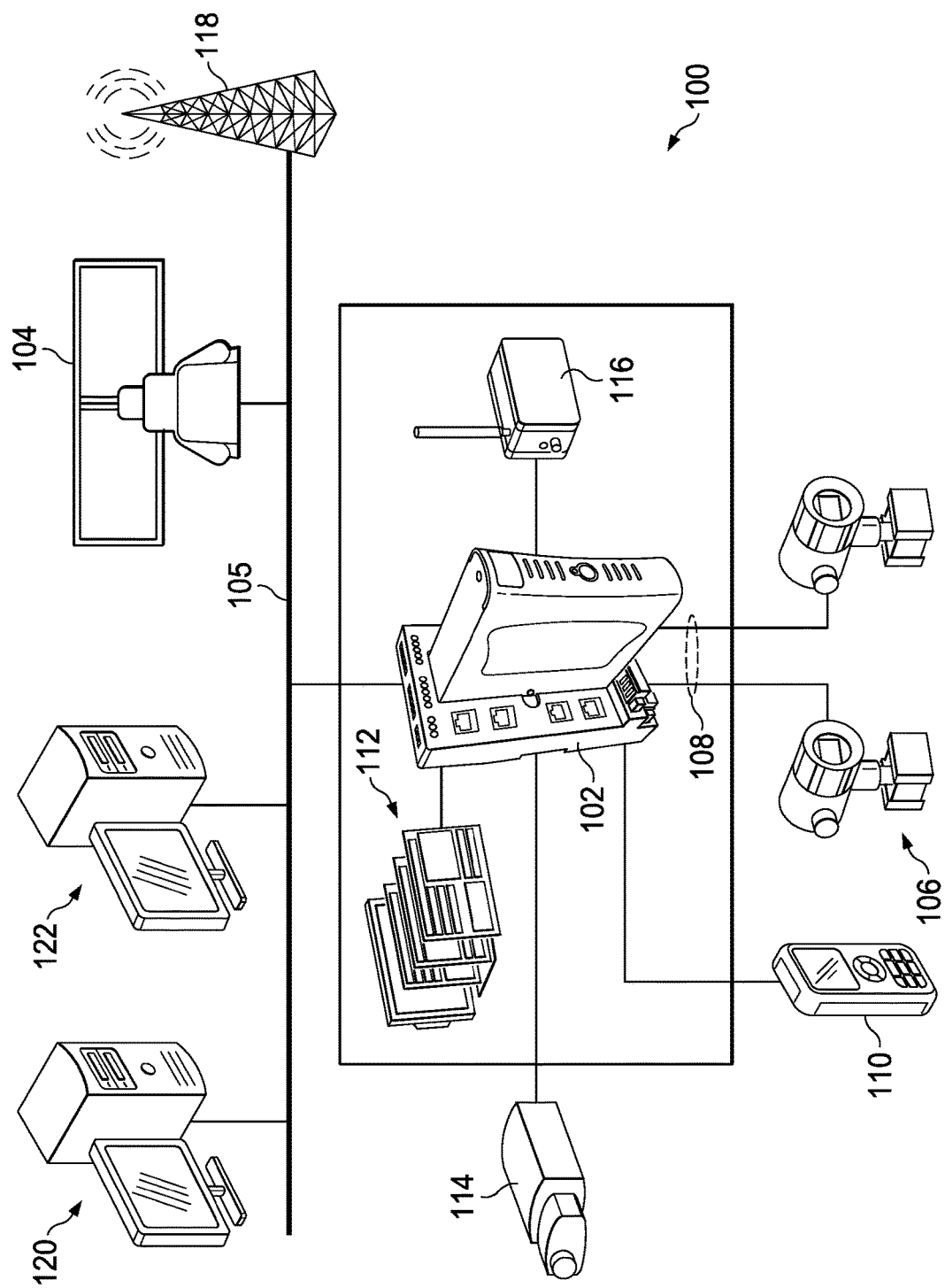
FIG. 1 illustrates an example industrial process control and automation system having a remote terminal unit (RTU) according to this disclosure.

FIG. 1 illustrates an example industrial process control and automation system 100 having an RTU 102 according to this disclosure. Note that the RTU 102 may also be referred to in the art as a remote telemetry unit. Also note that while a single RTU 102 is shown here, the system 100 could include any number of RTUs 102 distributed in one or more geographical areas.

The RTU 102 represents a device or system that provides localized control and data access at a site that is remote from a supervisory control and data acquisition (SCADA) system or other control system 104. For example, the RTU 102 could be positioned at or near an oil, gas, or water well or power substation. In these or other situations, the RTU 102 can be used to collect data from local sensors and process the data to generate control signals for local actuators. The RTU 102 can also interact with the control system 104 as needed.

In this way, process control and automation functions can be provided at locations remote from the control system 104. The control system 104 is shown as communicating with the RTU 102 over a wired network 105 and using wireless connections, such as via microwave, cellular, or other radio frequency (RF) communications. However, the RTU 102 could communicate with the control system 104 over any suitable wired or wireless connection(s). In some embodiments, the components 102-104 could ordinarily communicate using a wired connection, with wireless communications used as backup. In other embodiments, the RTU 102 could be used in a location where communications over a wired network 105 are difficult or impossible, and communications with the RTU 102 could only occur wirelessly.

The RTU 102 also communicates and interacts with one or more industrial field devices 106. The field devices 106 could include sensors that measure one or more characteristics of a process, actuators that alter one or more characteristics of a process, or other industrial field devices. In this example, the RTU 102 uses wired connections 108 to communicate with the field devices 106. The wired connections 108 represent any suitable physical connections between the RTU 102 and the field devices 106.

The RTU 102 in this example also communicates and interacts with at least one local user device 110. The user device 110 could be used by personnel to interact with the RTU 102 or with the field devices 106 or the control system 104 communicating with the RTU 102. The user device 110 includes any suitable structure supporting user interaction with an RTU.

Various other components could optionally be used with the RTU 102. For example, the RTU 102 could interact with one or more human-machine interfaces (HMIs) 112, such as display screens or operator consoles. The HMIs 112 can be used to receive data from or provide data to the RTU 102. One or more security cameras 114 (such as Internet Protocol cameras) could be used to capture still or video images and to provide the images to a remote location (such as a security center) via the RTU 102. A wireless radio 116 could be used to support wireless communications between the RTU 102 and a remote access point 118, which communicates with the control system 104 or other remote systems via the network 105. The other remote systems can include a field device manager (FDM) 120 or other asset manager and/or an RTU builder 122. The FDM 120 can be used to configure and manage assets such as field devices (including the field devices 106), and the RTU builder 122 can be used to configure and manage RTUs (including the RTU 102).

The RTUs 102 can be used in a variety of industries and in a variety of ways. For example, in the oil and gas industry, the RTUs 102 can be used with oil and gas wells and pipelines. The RTUs 102 can be integrated with analog input/output (AI/AO) circuits and digital input/output (DI/DO) circuits to acquire and control fielding signals, such as temperature, pressure, or volume signals. The RTUs 102 can also transmit data such as this to an external control or automation system 104 via one or more communication ports, such as Ethernet, RS232, or RS485 ports. However, some equipment to be monitored or controlled using RTUs 102 can be located in extremely remote or wide areas, such as in a desert.

These types of uses can cause various problems with conventional RTUs. For example, temperatures in extreme environments like deserts can be particularly harsh. As examples, during heat waves in the hottest desert spots, the climate can soar to more than 50° C. (122° F.), and surface temperatures at specific locations can be more than 70° C. (158° F.). The maximum operating temperature of conventional RTUs is often below 70° C., meaning those RTUs cannot be used in certain hostile environments.

Moreover, there is usually no completed infrastructure in remote areas, so alternating current (AC) power is normally not available. Solar power can be used to power RTUs in desert environments given the abundance of sunlight in the desert. The power consumption of an RTU typically defines the needed capabilities of a solar power system, including the size of a solar panel, the capacity of a rechargeable battery, a voltage regulator needed, and a steelwork size of support frames for the solar equipment. Higher power consumption by an RTU typically results in higher costs for a solar power system. In addition, higher power consumption by an RTU typically increases thermal dissipation requirements within the RTU, which can be problematic when the RTU is used in an environment having elevated temperatures.

The RTU 102 described in this patent document can operate in environments having elevated temperatures while consuming lower amounts of power. Many factors can affect the thermal dissipation and operating temperature of a product. In the RTU 102, various mechanical designs and hardware placements can be used to achieve improved thermal dissipation. Moreover, software/firmware control algorithms can be used to help reduce power consumption by the RTU 102. For example, in some instances, not all functions of an RTU 102 are used or needed, and software/firmware instructions can be used to disable unused circuits in order to reduce power consumption. Different working modes of the RTU 102 can be set according to different applications in order to realize improved efficiency and reduced power consumption. In addition, circuits can be used to measure temperature (such as the internal temperature of the RTU 102 or the temperature of the external ambient environment) and calculate power consumption of the RTU 102. If the operating temperature or power consumption exceeds one or more threshold values, software/firmware control algorithms can trigger changes that reduce the power consumption of the RTU 102, such as by reducing the clock rate of a processing device (like a CPU) or a memory device (like an SDRAM) in the RTU 102.

Depending on the implementation, any of the following features or any combination of the following features could be obtained:
  the maximum operating temperature of the RTU 102 can reach elevated temperatures, such as about 75° C., 85° C., or even more;
  the RTU 102 can select the best working mode automatically (possibly based on predefined user settings) to optimize the power consumption of the RTU 102; and
  the power consumption of the RTU 102 can be ultra-low compared to conventional RTUs, which helps to improve the operating temperature of the RTU 102 (since less power consumption causes less heat) and reduce system costs (since smaller or less expensive solar power systems can be used).

Additional details of the RTU 102 are provided below. These details include a description of an example mechanical design for the RTU 102 that can be used to increase the maximum operating temperature of the RTU 102. These details also include a description of example software/firmware control algorithms that can be used to reduce power consumption and increase the maximum operating temperature of the RTU 102.

Although FIG. 1 illustrates one example of an industrial process control and automation system 100 having an RTU 102, various changes may be made to FIG. 1. For example, the system 100 could include any number of each component. Also, the functional division shown in FIG. 1 is for illustration only. Various components in FIG. 1 could be combined, subdivided, or omitted and additional components could be added according to particular needs. Further, while shown as being used with wired field devices, the RTU 102 could be used with only wireless field devices or with both wired and wireless field devices. In addition, FIG. 1 illustrates one example operational environment where an RTU 102 can be used. One or more RTUs could be used in any other suitable system.

Figure 2:
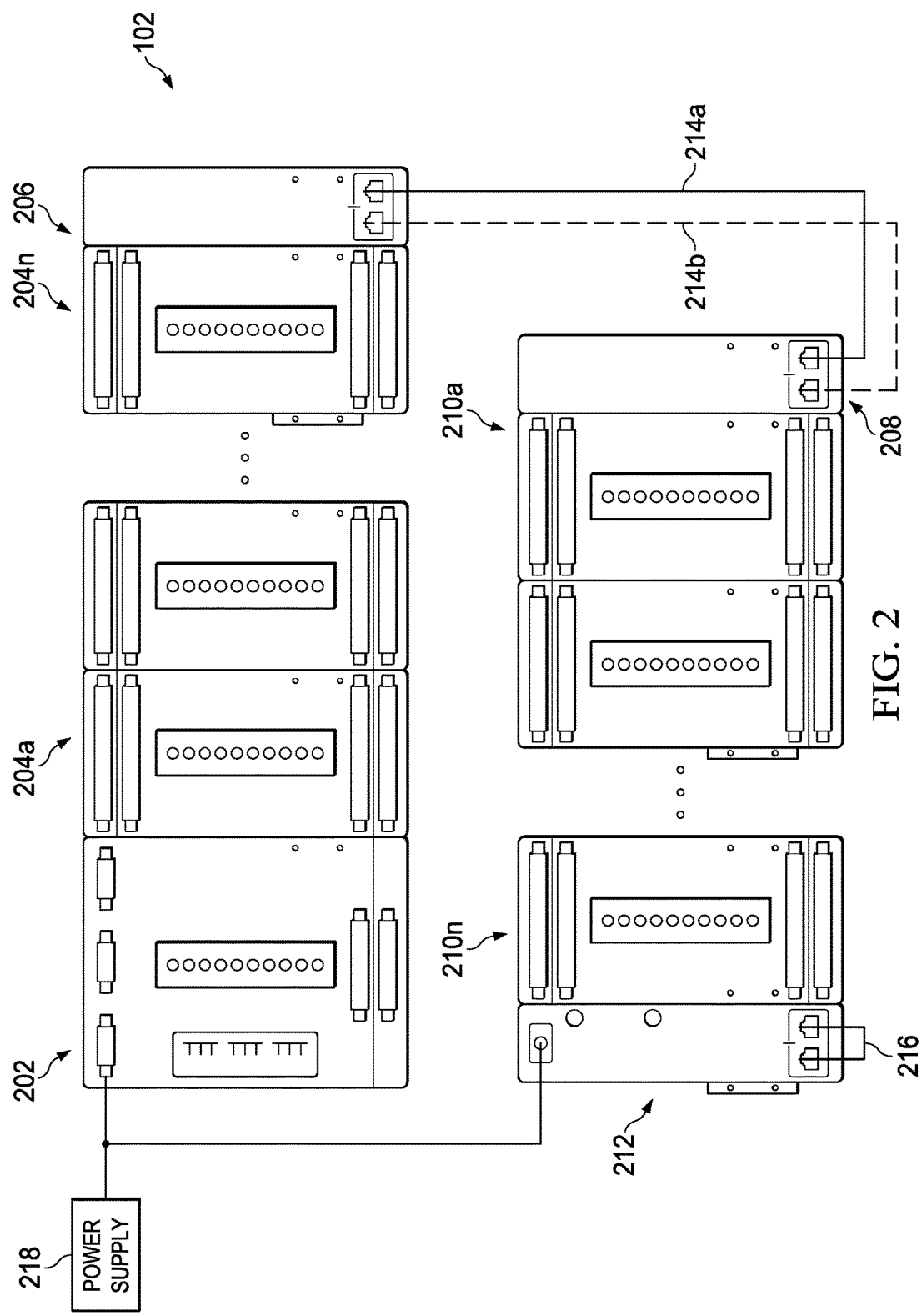
FIG. 2 illustrates an example functional architecture for an RTU according to this disclosure.

FIG. 2 illustrates an example functional architecture for an RTU 102 according to this disclosure. For ease of explanation, the RTU 102 is described as being used in the system 100 of FIG. 1. However, the RTU 102 could be used in any other suitable system.

As shown in FIG. 2, the RTU 102 includes a controller module 202, a first set of I/O modules 204a-204n, and an expansion board 206. The controller module 202 represents the module that executes control logic and other functions of the RTU 102. For example, the controller module 202 could execute control logic that analyzes sensor data and generates control signals for actuators. The controller module 202 could also execute functions that control the overall operation of the RTU 102, such as functions supporting communications with external devices or systems. The controller module 202 includes any suitable structure for controlling one or more operations of an RTU. In some embodiments, the controller module 202 includes at least one processing device that executes a LINUX or other operating system. Note that while one controller module 202 is shown here, the RTU 102 could include multiple controller modules (such as a redundant pair of controller modules).

The I/O modules 204a-204n support various I/O channels. Data can be transported between the controller module 202 and external devices or systems (such as the field devices 106) via the I/O channels of the I/O modules 204a-204n. Example types of I/O channels include analog input (AI) (with or without digital communication), analog output (AO) (with or without digital communication), digital input (DI), digital output (DO), and pulse accumulation input (PI) channels. In some embodiments, one or more of the I/O modules 204a-204n supports the use of reconfigurable I/O channels, which allows the I/O channels to be configured as needed for a particular installation. However, the use of reconfigurable I/O channels is optional in the RTU 102. The RTU 102 can include any number of I/O modules 204a-204n. In some embodiments, a specified number of I/O modules 204a-204n (such as eight modules) can be built into the RTU 102.

The expansion board 206 allows the RTU 102 to be coupled to an expansion board 208, which is coupled to a second set of I/O modules 210a-210n. The I/O modules 210a-210n could have the same or similar structure as the I/O modules 204a-204n, and any number of I/O modules 210a-210n could be used in the second set (such as eight modules). An expansion board 212 can be used to couple to a third set of I/O modules. Additional I/O modules can be added in a similar manner. In general, any combination of fixed and/or reconfigurable I/O channels could be used in the RTU 102.

Each expansion board 206, 208, 212 includes any suitable structure facilitating the addition of one or more I/O modules to an RTU. In this example, two electrical paths 214a-214b are formed through the RTU 102, and the electrical paths 214a-214b meet at a loop 216. The electrical paths 214a-214b could be formed in any suitable manner, such as by using Ethernet connections and electrical paths through the I/O modules and expansion boards. The loop 216 can be used to indicate that no additional I/O modules are presently connected to the RTU 102. Note, however, that the loop 216 could also be placed on the expansion board 206 to indicate that no additional sets of I/O modules are currently connected to the RTU 102.

A power supply (PS) 218 provides operating power to the components of the RTU 102. The power supply 218 includes any suitable structure(s) configured to provide operating power to an RTU. For example, the power supply 218 could include one or more batteries, solar panels, fuel cells, or other source(s) of power.

In some embodiments, the controller module 202 receives runtime and diagnostic data from one or more field devices 106 via one or more I/O modules, such as the I/O modules 204a-204n, 210a-210n. The controller module 202 can provide the runtime data and historical data (which could be stored in the controller module 202 or other location) to the control system 104. The controller module 202 can also provide the diagnostic data to the FDM 120.

In particular embodiments, the controller module 202 executes a LINUX operating system, supports communication with the control system 104 using a MODBUS or DNP3 protocol, and communicates with the FDM 120 using a HART OVER IP (HART-IP) protocol. Also, the International Electrotechnical Commission (IEC) 61131 standard can be supported by the controller module 202 for programming the RTU 102.

Although FIG. 2 illustrates one example of a functional architecture for an RTU 102, various changes may be made to FIG. 2. For example, the RTU 102 could include any number of controller modules and I/O modules. Also, the RTU 102 need not support the use of an expandable number of I/O modules.

Figure 3:
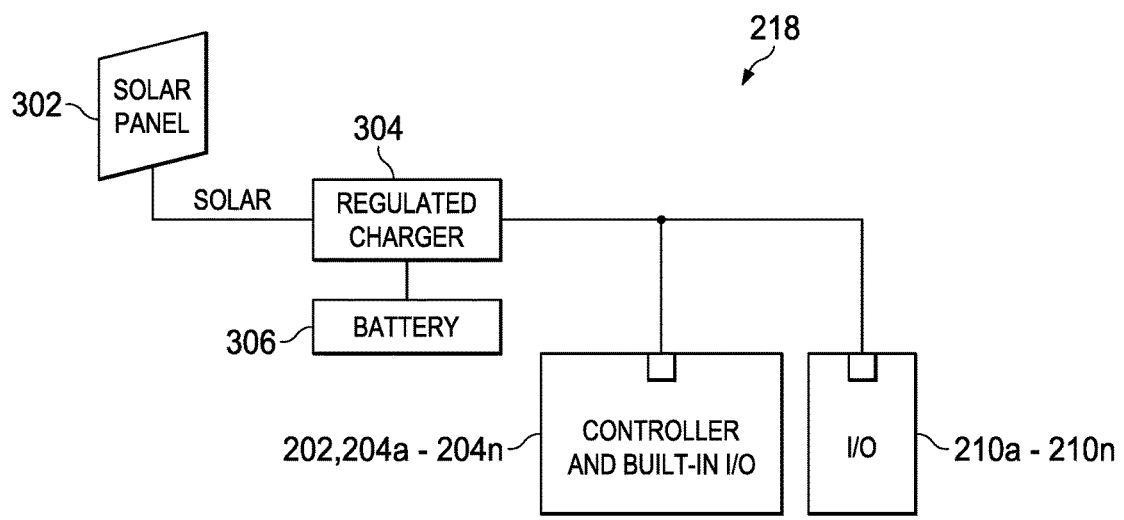
FIG. 3 illustrates an example power supply for an RTU according to this disclosure.

FIG. 3 illustrates an example power supply 218 for an RTU 102 according to this disclosure. As shown in FIG. 3, the power supply 218 includes at least one solar panel 302, a regulated charger 304, and at least one battery 306. Each solar panel 302 includes any suitable structure for converting solar energy into electrical energy. In some embodiments, one or more solar panels 302 generate a direct current (DC) voltage of between 10-30 VDC.

The regulated charger 304 converts electrical energy into a form suitable for use by components of the RTU 102. For example, the regulated charger 304 could convert the 10-30 VDC signal from the solar panel(s) 302 into a 24 VDC signal for the controller module 202 and the I/O modules 204a-204n (as well as any additional I/O modules, such as I/O modules 210a-210n). The regulated charger 304 also provides electrical energy from the solar panel(s) 302 to the one or more batteries 306 for charging of the batteries 306. The regulated charger 304 can further provide electrical energy from the one or more batteries 306 to the components of the RTU 102 to supplement or replace electrical energy from the solar panel(s) 302. This could occur, for instance, during times when the solar panel(s) 302 cannot generate adequate power (such as at night or during bad weather).

Although FIG. 3 illustrates one example of a power supply 218 for an RTU 102, various changes may be made to FIG. 3. For example, the power supply 218 could include any number of solar panels, regulated chargers, and batteries. Also, any other or additional components could be used to supply power to an RTU 102.

Figure 4A:
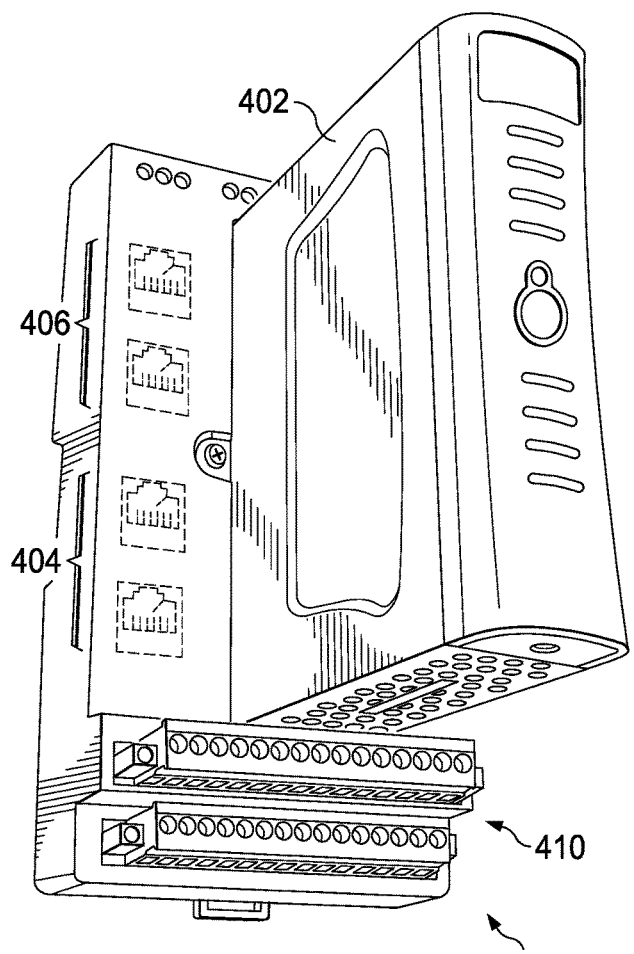

FIGS. 4A through 8B illustrate an example mechanical design for an RTU 102 according to this disclosure. As shown in FIGS. 4A through 4C, a housing 402 is used to encase and protect other components of the RTU 102. The housing 402 also provides access to various other components of the RTU 102, such as one or more ports or terminals. The housing 402 can have any suitable size, shape, and dimensions and be formed from any suitable material(s). For example, as described below, at least part of the housing 402 could be formed using one or more materials with a high thermal conductivity (such as aluminum).

The RTU 102 also includes two uplink/downlink ports 404, two RS232 ports 406, and two RS485 ports 408. The ports 404 can be used to couple the RTU 102 to higher-level or lower-level devices, such as the control system 104, FDM 120, or RTU builder 122 via the network 105 or the wireless radio 116. The ports 404 could represent any suitable structures for coupling to one or more communication links, such as Ethernet ports. The RS232 ports 406 and the RS485 ports 408 could be used to couple the RTU 102 to one or more field devices or other devices that use the RS232 or RS485 serial protocol.

Various I/O terminals 410 are also used to couple the RTU 102 to one or more field devices. The I/O terminals 410 here can be coupled to the I/O modules 204a-204n and thereby provide a communication path between the I/O modules 204a-204n and the field device(s) coupled to the I/O terminals 410. The I/O terminals 410 can be coupled to various types of field devices, and the I/O modules 204a-204n can support suitable I/O channels for communicating with the field devices. The I/O terminals 410 include any suitable structures for coupling to different communication paths, such as screw terminals.

A power terminal 412 can be used to couple the RTU 102 to a power supply, such as the power supply 218. A slot 414 provides access to additional connectors, such as the expansion board 206 for coupling to the I/O modules 210a-210n.

Figure 4B:
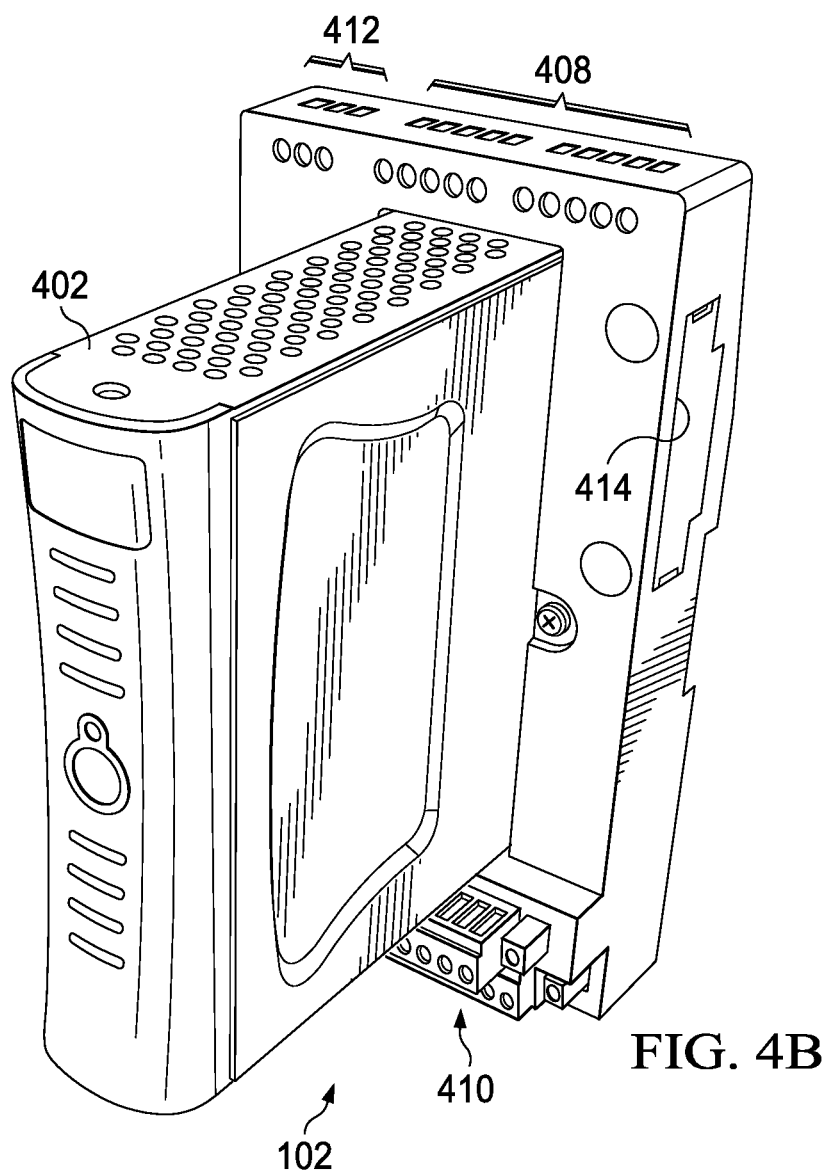
Figure 4C:
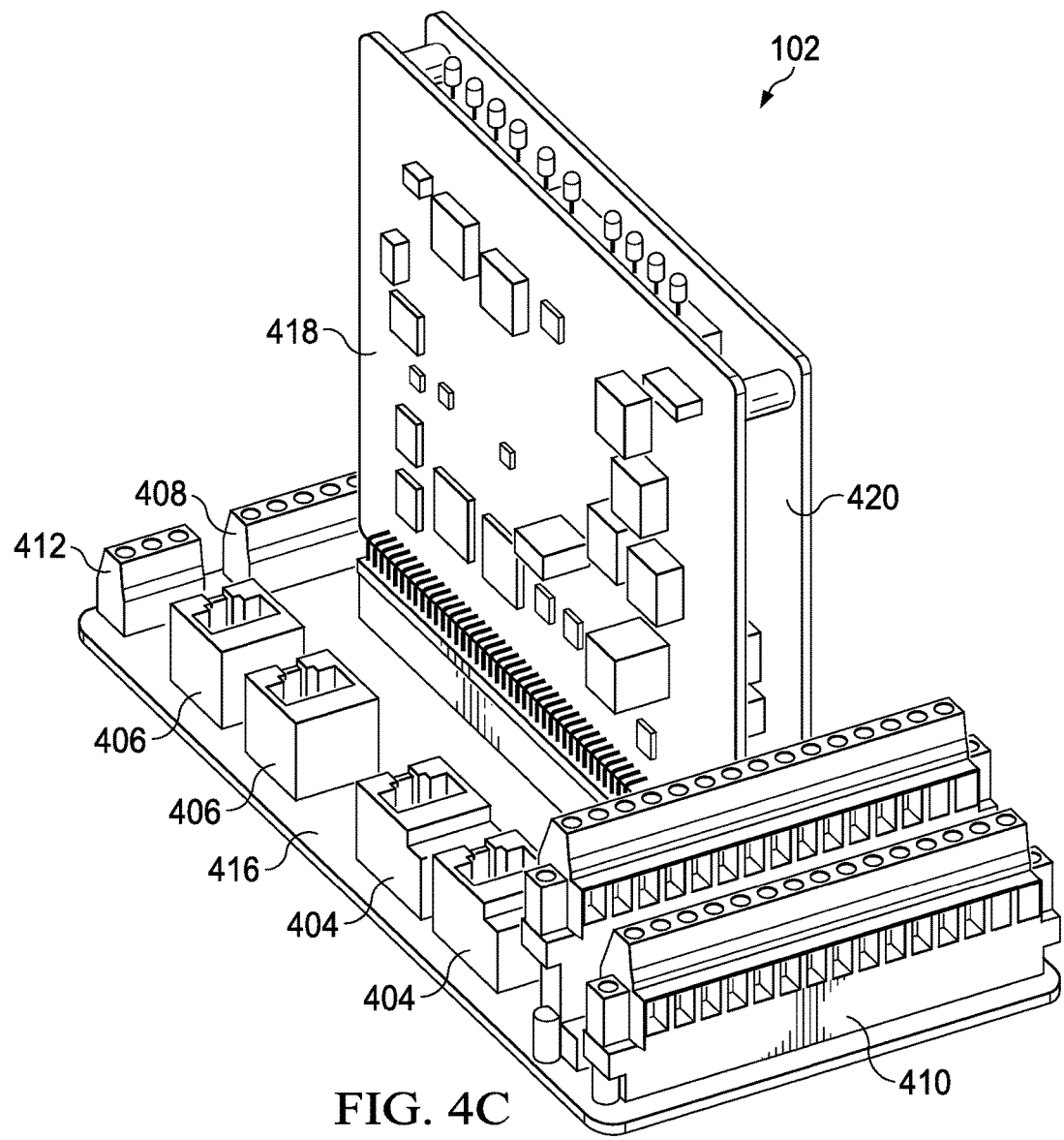

Note that the numbers and types of ports and terminals shown in FIGS. 4A through 4C are for illustration only. The RTU 102 could include any suitable type(s) and number(s) of interfaces as needed or desired.

As shown in FIG. 4C, the RTU 102 further includes three printed circuit board assemblies (PCBAs). A first circuit board 416 includes the substrate on which the ports 404-408, I/O terminals 410, and other input/output components can be located. The circuit board 416 represents any suitable substrate, such as an Input Output Termination Assembly (IOTA) board. For this reason, the circuit board 416 may be referred to below as the IOTA board 416.

A second circuit board 418 and a third circuit board 420 are coupled to the IOTA circuit board 416. The second circuit board 418 represents a board having at least one processing device that executes an operating system for the RTU 102. For this reason, the circuit board 418 may be referred to below as the kernel board 418. The circuit board 418 could also include at least one memory, a power supply or power converter, and one or more communication interfaces. As a particular example, the circuit board 418 could include a field programmable gate array (FPGA).

The third circuit board 420 represents an application board that contains I/O modules, such as the I/O modules 204a-204n. For this reason, the circuit board 420 may be referred to below as the application board 420. If implemented using reconfigurable I/O channels, the circuitry on the circuit board 420 can be used to reconfigure an I/O channel into an AI (with or without digital communication), AO (with or without digital communication), DI, DO, or PI channel. As a particular example, the circuit board 420 could include an application specific integrated circuit (ASIC) that includes the switches and other components used to provide reconfigurable I/O channels.

FIG. 5 illustrates an example of the kernel board 418 in the RTU 102. As shown in FIG. 5, the kernel board 418 includes at least one processing device 502. The processing device(s) 502 can execute an operating system and otherwise perform various operations to support the functions of the controller module 202. Each processing device 502 includes any suitable processing or computing device, such as a microprocessor, microcontroller, digital signal processor, FPGA, ASIC, or discrete logic devices. In particular embodiments, the processing device 502 represents a XILINX ZYNQ-7000 Extensible Processing Platform (EPP).

The processing device(s) 502 can include or otherwise support one or more memory interfaces/controllers 504, which could be used to support data transfers to and from one or more memory devices 506. Any suitable memory interfaces/controllers 504 could be used in the RTU 102, such as one or more serial peripheral interfaces (SPIs), double data rate (DDR) interfaces, secure digital input output (SDIO) interfaces, or inter-integrated circuit (I$^2$C) controllers. Similarly, any suitable memory devices 506 could be used in the RTU 102, such as one or more Flash memories; DDR3, magnetoresistive, or other random access memories; secure digital (SD) cards; or electrically erasable programmable read only memories or other read-only memories. At least one of the memory devices 506 could be used to store data during power losses by the RTU 102 so that the data can be retrieved when power is restored to the RTU 102.

The processing device(s) 502 can also include or otherwise support one or more communication interfaces 508, which could be used to support data transfers to and from one or more communication transceivers/transformers 510. Any suitable communication interfaces 508 could be used in the RTU 102, such as one or more SPIs, universal asynchronous receiver/transmitter (UART) interfaces, or reduced media independent interfaces (RMIIs). Also, any suitable communication transceivers/transformers 510 could be used in the RTU 102, such as one or more Ethernet switches, Ethernet transceivers, RS232 transceivers, or RS485 transceivers. A connector 512 couples the kernel board 418 to the IOTA board 416. Among other things, the communication transceivers/transformers 510 can communicate with the IOTA board 416 via the connector 512. The connector 512 includes any suitable structure configured to transport signals between circuit boards.

Circuitry 514 receives input power from the IOTA board 416 via the connector 512. The circuitry 514 provides various functions, such as hot swap, power regulation, and supervisory functions. As a particular example, the circuitry 514 could receive a 24 VDC signal as input power and convert the input power into one or more other forms. For instance, the circuitry 514 could convert a 24 VDC input power into 1.8 VDC, 3.3 VDC, and 5 VDC signals. The circuitry 514 can also exchange power monitoring and management information with the processing device 502. This allows, for example, the processing device 502 to perform or trigger functions during over-voltage or under-voltage conditions.

The processing device(s) 502 can optionally include or otherwise support control logic 516 for controlling the configuration of reconfigurable I/O channels, such as channels in the I/O modules 204a-204n, 210a-210n. For example, the control logic 516 can provide control signals that configure different circuits in the I/O modules 204a-

204*n*, 210*a*-210*n* in order to configure the I/O channels appropriately. A connector 518 couples the kernel board 418 to the application board 420, which allows the control logic 516 to provide configuration signals to the application board 420. The connector 518 also allows the circuitry 514 to provide DC power to the application board 420. The connector 518 includes any suitable structure configured to transport signals between circuit boards.

A clock source 520 is used to provide one or more clock signals to the processing device(s) 502. The clock source 520 includes any suitable source of one or more clock signals, such as a local oscillator.

Figure 6:
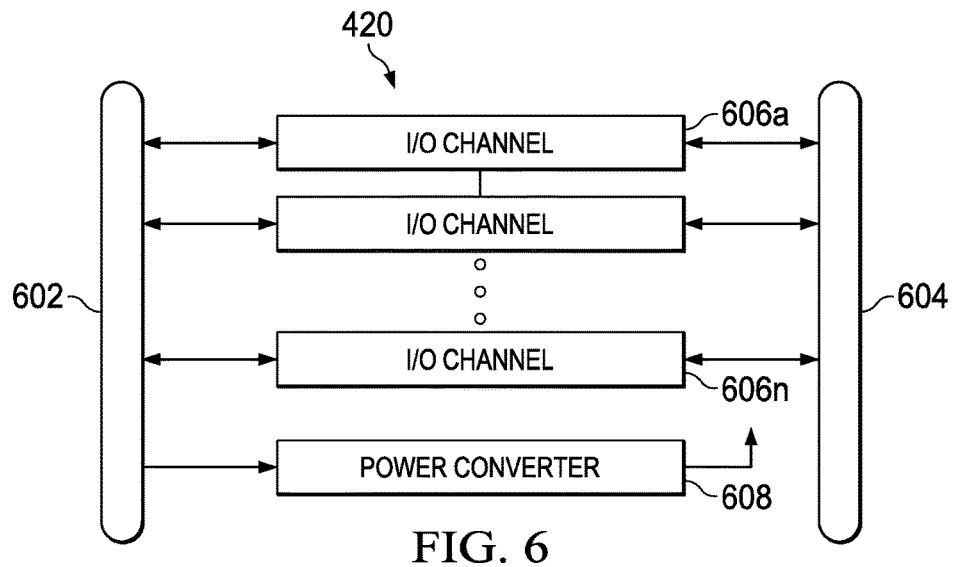

FIG. 6 illustrates an example of the application board 420 in the RTU 102. The application board 420 generally includes the data acquisition and output control circuits for the RTU 102. As shown in FIG. 6, the application board 420 includes a connector 602 that couples the application board 420 to the kernel board 418. The application board 420 also includes a connector 604 that couples the application board 420 to the IOTA board 416. Each connector 602-604 includes any suitable structure configured to transport signals between circuit boards.

The application board 420 further includes multiple I/O channels 606*a*-606*n*. The I/O channels 606*a*-606*n* here could represent or form at least a part of one or more I/O modules 204*a*-204*n* in the RTU 102. In some embodiments, each I/O channel 606*a*-606*n* can operate as an AI (with or without digital communication), AO (with or without digital communication), DI, DO, or PI channel. In particular embodiments, one or more I/O channels 606*a*-606*n* are fixed, and each can operate only as a single type of channel. In other particular embodiments, one or more I/O channels 606*a*-606*n* are reconfigurable, and each can be configured as desired to operate as a selected type of channel. Example types of reconfigurable I/O channels are shown in U.S. Pat. No. 8,072,098; U.S. Pat. No. 8,392,626; and U.S. Pat. No. 8,656,065 (all of which are hereby incorporated by reference in their entirety).

In this example, there is no power regulator in the application board 420, and power is received from the kernel board 418 via the connector 602 (although this need not be the case). A power converter 608 can be used to convert the power received from the kernel board 418. For example, the power converter 608 could include a boost converter that boosts a voltage received from the kernel board 418, such as from 5 VDC to 6 VDC.

Figure 7:
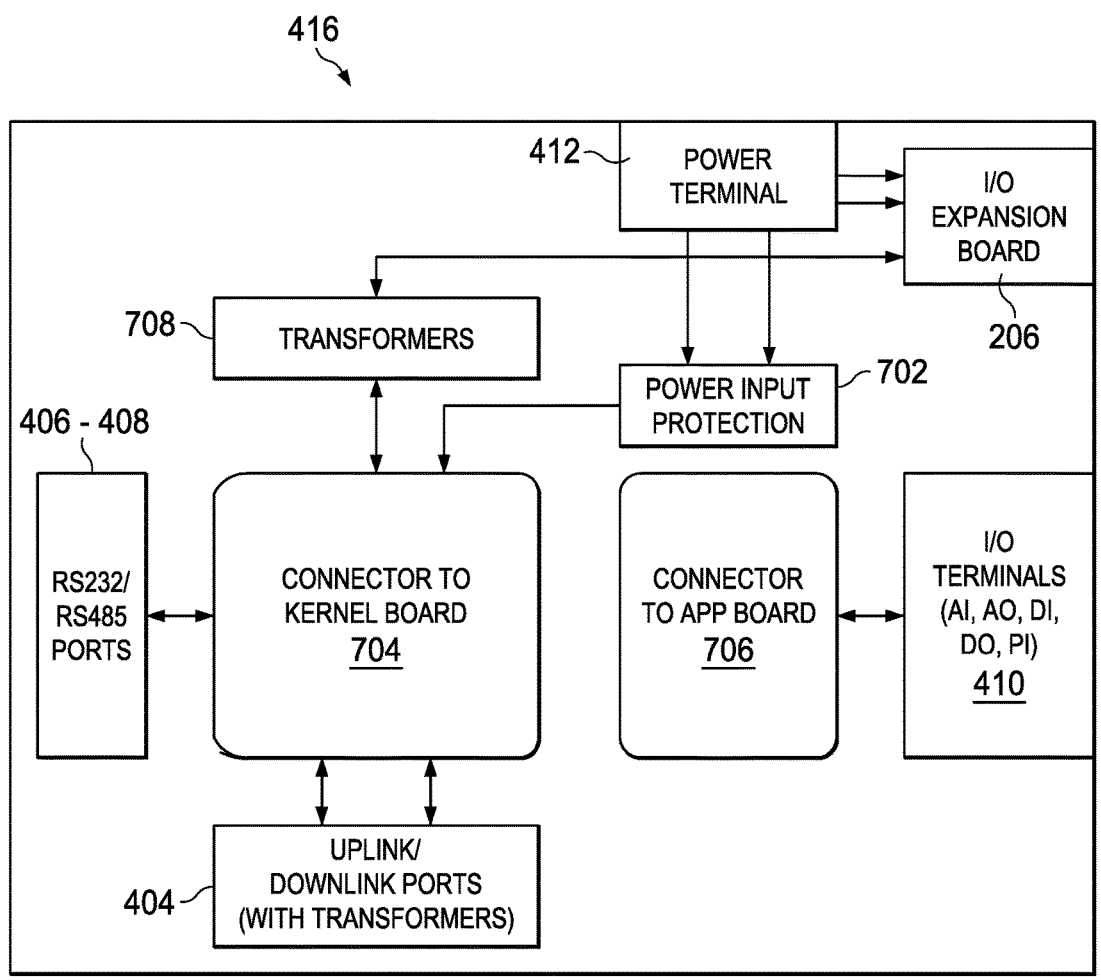

FIG. 7 illustrates an example IOTA board 416 in the RTU 102. As shown in FIG. 7, the IOTA board 416 includes the uplink/downlink ports 404, the RS232 and RS485 ports 406-408, the I/O terminals 410, and the power terminal 412 described above. The IOTA board 416 also includes the I/O expansion board 206 described above.

A power input protection circuit 702 receives power from the power terminal 412 and provides input power to the kernel board 418 via a connector 704. For example, the protection circuit 702 could provide over-voltage protection for the RTU 102. The protection circuit 702 includes any suitable structure(s) providing power protection. A connector 706 allows the application board 420 to be coupled to the I/O terminals 410. Each connector 704-706 includes any suitable structure configured to transport signals between circuit boards.

Transformers 708 are used to couple the I/O expansion board 206 to the kernel board 418 via the connector 704. This may allow, for example, the control logic 516 in the kernel board 418 to properly configure and control additional I/O modules, such as I/O modules 210*a*-210*n*, coupled to the RTU 102. The transformers 708 include any suitable structures for helping to isolate the additional I/O modules from other components of the RTU 102. In some embodiments where Ethernet cables are used to form the electrical paths 214*a*-214*b*, the transformers 708 could represent Ethernet transformers.

Figure 8A:
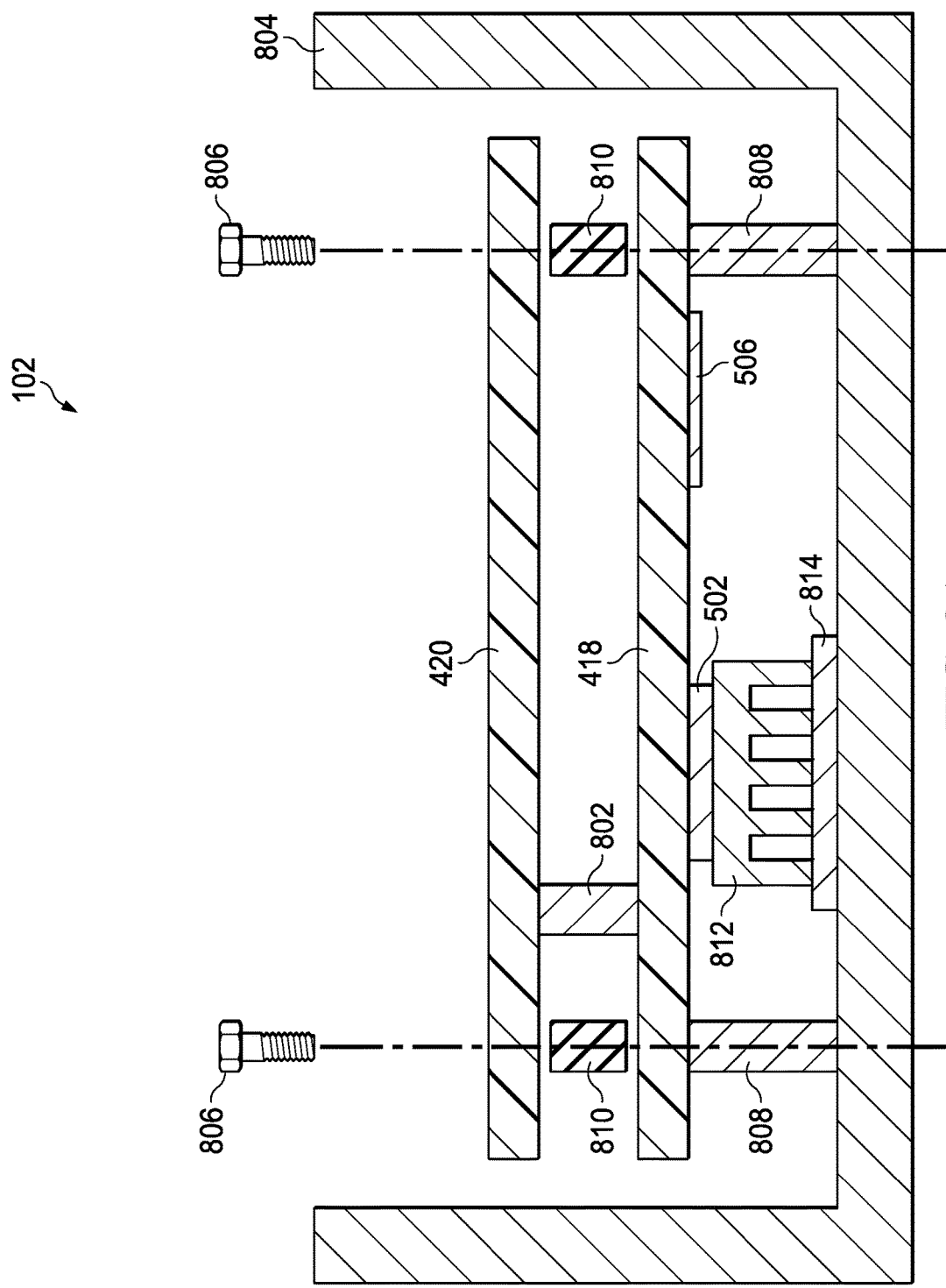
Figure 8B:
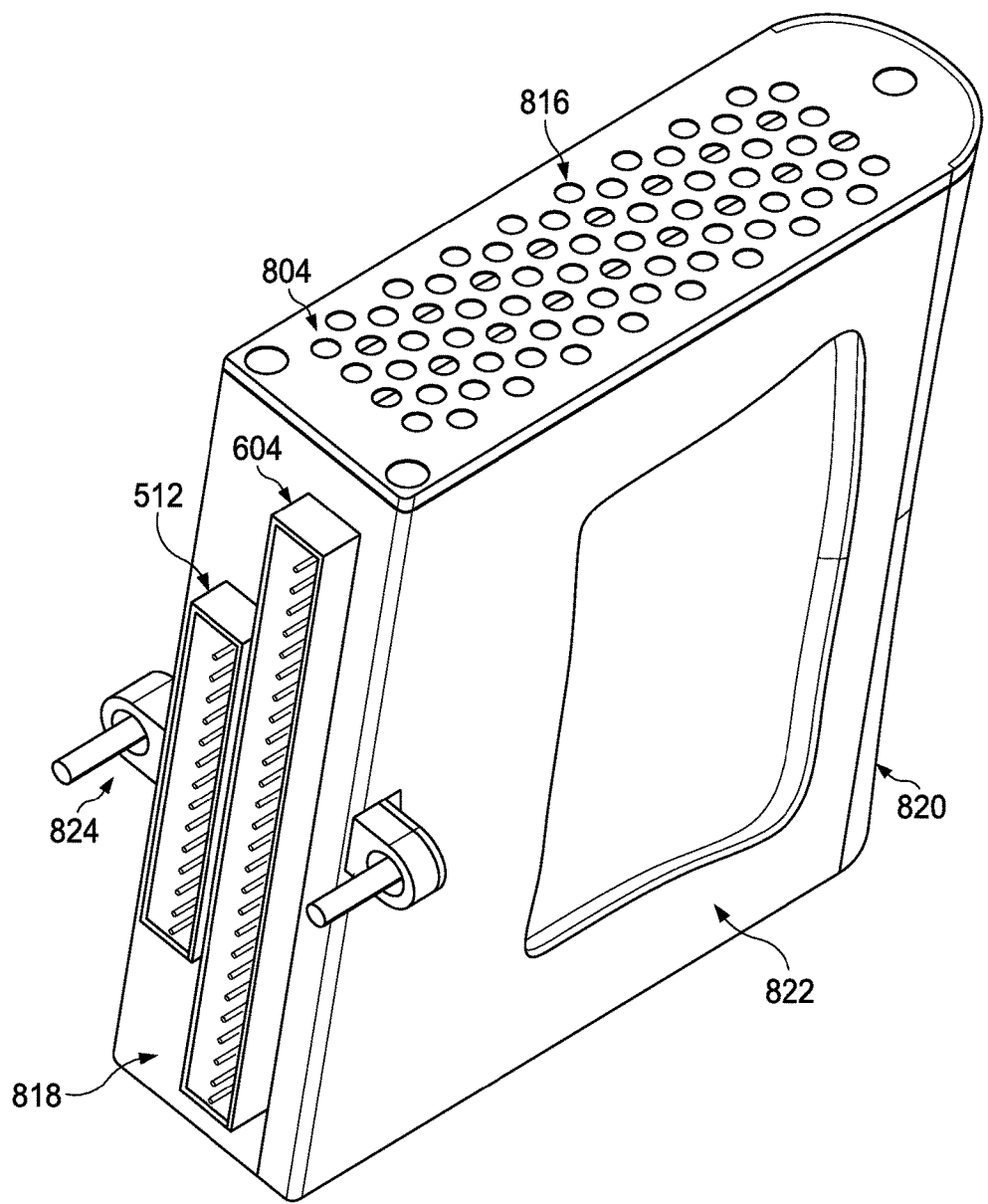

FIGS. 8A and 8B illustrate a portion of the RTU 102 that houses the kernel board 418 and the application board 420. As shown in FIG. 8A, the kernel board 418 includes the processing device(s) 502 and the memory device(s) 506. The boards 418-420 are connected together via a connector 802, which could collectively represent the connectors 518, 602 described above or a cable or other structure that couples the connectors 518, 602.

A shell 804 forms part of the housing 402 for the RTU 102. The shell 804 encases, contains, or otherwise holds at least the boards 418-420 of the RTU 102. The shell 804 is formed from one or more thermally conductive material(s). This allows heat generated within the RTU 102, such as by the processing device(s) 502, to be exhausted from the RTU 102 through the shell 804. The shell 804 could have any suitable size, shape, and dimensions. The shell 804 could also be formed from any suitable material(s), such as aluminum.

The boards 418-420 are secured within the RTU 102 in this example using screws 806, which can be inserted through the boards 418-420 and attached to screw stands 808. The screw stands 808 are attached to or form a part of the shell 804. The screws 806 can be rotated into the screw stands 808 to lock the boards 418-420 in place within the RTU 102. The screws 806 can also be rotated out of the screw stands 808 to remove the boards 418-420 from the RTU 102. Note, however, that other mechanisms could be used to secure the boards 418-420 in the RTU 102. Two spaces 810 help to maintain separation of the boards 418-420 when the boards 418-420 are secured within the RTU 102. Each spacer 810 includes any suitable structure for separating circuit boards or other structures, such as nylon spacers.

The RTU 102 further includes a heat sink 812 and a thermal pad 814. The heat sink 812 receives thermal energy from the processing device(s) 502 and provides that thermal energy to the thermal pad 814. The thermal pad 814 provides the thermal energy to the shell 804, where the thermal energy can radiate away from or otherwise leave the RTU 102. The heat sink 812 includes any suitable structure for receiving thermal energy from at least one processing device or other component. The heat sink 812 could have any suitable size, shape, and dimensions and be formed from any suitable material(s) (such as metal). The thermal pad 814 includes any suitable material(s) for transferring energy from a heat sink to another structure. The thermal pad 814 could be formed from at least one deformable material so that, when the kernel board 418 is inserted into the shell 804 and attached using the screws 806, the heat sink 812 pushes into the thermal pad 814 and forms a good thermal contact with the shell 804. This allows the processing device(s) 502 to be cooled rapidly in the RTU 102.

As shown in FIG. 8A, the shell 804 could have two sides and a bottom surface, where the boards 418-420 are secured to the bottom surface of the shell 804. As shown in FIG. 8B, at least one side of the shell 804 could include ventilation holes 816 or other structures that allow air to flow through the shell 804. Three covers 818-822 (along with the shell 804) can be used to completely encase or surround the boards 418-420. The cover 818 here provides access so the connectors 512, 604 of the boards 418-420 can be coupled to the IOTA board 416. The covers 818-822 can be attached to the shell 804 or each other using any suitable mechanism(s), such as screws or bolts.

Connectors 824 here can be used to secure the assembly shown in FIG. 8B to the remainder of the RTU 102. For example, the connectors 824 could represent screws or bolts that attach to corresponding receptacles in another portion of the housing 402. O-rings or other seals could be placed around the connectors 824 prior to coupling to the other portion of the housing 402.

Typically, the hottest component in an RTU is its CPU because the CPU operates at high frequencies and consumes a large amount of power. In an extreme condition like a desert, if the cooling system for a CPU is not adequate, heat energy released by the CPU cannot dissipate quickly enough and instead gathers in the RTU's housing. This can heat adjacent components in the RTU and increase the internal temperature within the RTU's housing. At the same, the CPU's internal temperature continues to rise higher and higher. At some point, the CPU or another component within the RTU can break down due to excessive temperature.

In the RTU 102, the shell 804 can be formed using aluminum or other heat-conducting material(s). The heat sink 812 is glued onto or otherwise secured to the processing device(s) 502 but does not directly contact the shell 804 (since both can be metal and therefore difficult to connect directly). The thermal pad 814 can deform and has a high thermal conductivity. After the heat sink 812 contacts the thermal pad 814, the thermal dissipation area from the processing device(s) 502 is extended to the shell 804, helping the processing device(s) 502 to cool quickly.

Although FIGS. 4A through 8B illustrate one example of a mechanical design for an RTU 102, various changes may be made to FIGS. 4A through 8B. For example, the functional divisions between the boards 416-420 are for illustration only. Also, the form factors of the housing 402 and the shell 804 are examples only.

Figure 9:
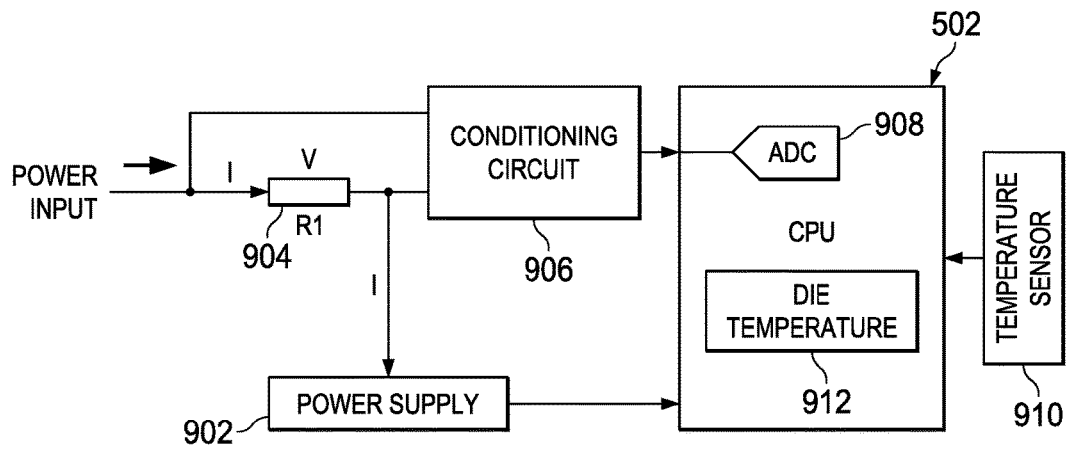
FIGS. 9 and 10 illustrate an example electrical design for controlling operating characteristics of an RTU and related details according to this disclosure.
Figure 10:
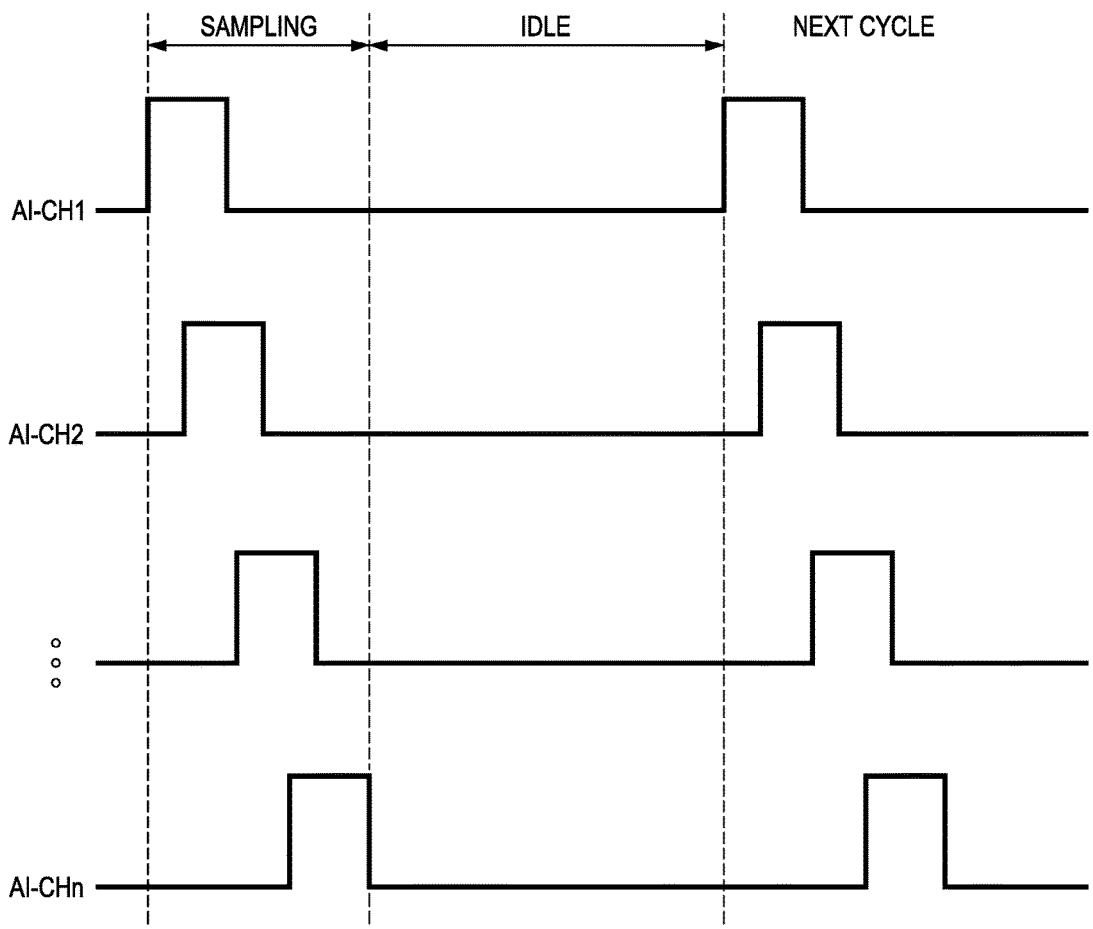

FIGS. 9 and 10 illustrate an example electrical design for controlling operating characteristics of an RTU 102 and related details according to this disclosure. As described above, the mechanical design of the RTU 102 can help to remove heat from inside the RTU 102 and increase the operating temperature range of the RTU 102. In addition, software/firmware control algorithms can be used to modify the operation of the RTU 102 to reduce its power consumption, which also helps in the thermal management of the RTU 102.

There are various techniques that could be used to detect power consumption or temperature associated with operation of the RTU 102 For example, as shown in FIG. 9, the processing device(s) 502 can receive operating power from a power supply 902, which could represent part of the circuitry 514. A small resistor 904 can be placed within the main power loop of the RTU 102. When power is provided to the RTU 102, current flows through the resistor 904, creating a voltage across the resistor 904. A conditioning circuit 906 (which could also form part of the circuitry 514) converts the voltage into a suitable value that an analog-to-digital converter (ADC) 908 can recognize. Because the impendence input of the conditioning circuit 906 can be very high, no or very little current flows into the impendence input, and the current i substantially represents the current consumed by the RTU 102. The ADC 908 could be an individual chip or integrated into the processing device(s) 502 as shown in FIG. 9. The processing device(s) 502 can read the values generated by the ADC 908 and calculate the input current i and therefore the power consumption of the RTU 102.

One or more temperature sensors 910-912 can also be used with the RTU 102. The temperature sensor 910 could measure the temperature within the RTU's enclosure, such as within the shell 804 of the RTU 102, and provide temperature measurements to the processing device(s) 502. The temperature sensor 912 represents an on-chip sensor that can measure the die temperature of the processing device(s) 502. This allows the processing device(s) 502 to monitor its own operating temperature.

Once the processing device(s) 502 obtain(s) current, power consumption, temperature, or other measurements, one or more control algorithms executed by the processing device(s) 502 (such as software or firmware) could be used to control the power consumption and temperature of the RTU 102. For example, one or more threshold values could be set for enclosure and on-chip temperature measurements. As an example, the highest operating temperature of components with an industry could be about 85° C., so the enclosure temperature threshold could be set to some value less than 85° C., such as around 82° C. (to reserve some margin). If the actual enclosure temperature exceeds this threshold, the processing device(s) 502 and/or one or more peripheral device(s) (such as SDRAM) can derate its main frequency to reduce power consumption and thermal dissipation. As another example, the on-chip temperature threshold could be set to some value, such as one based on the type of processor being used. If the actual on-chip temperature exceeds the threshold, the processing device(s) 502 and/or one or more peripheral device(s) (such as SDRAM) can again derate its main frequency to reduce power consumption and thermal dissipation.

A threshold value for the input current i could be set in any suitable manner. For instance, an RTU 102 could be placed in a chamber, and the ambient temperature in the chamber could be set at or near the highest operating temperature (such as about 75° C.). Except for the two temperature sensors, all RTU functions can be enabled and run with full load and at a maximum frequency. The current used during this time (denoted $i_{max}$) represents the maximum power consumption and can be recorded. The threshold value for the input current i could then be set at some value, such as $i_{max}$ or $1.1 \times i_{max}$. This threshold may rarely if ever be violated since it is more likely that one or both temperature thresholds would be violated prior to the input current threshold being violated. However, there may be times when the input current threshold is violated (such as when both temperature sensors 910-912 have failed), at which point the processing device(s) 502 and/or one or more peripheral device(s) (such as SDRAM) can derate its main frequency to reduce power consumption and thermal dissipation.

Another mechanism for reducing power consumption by the RTU 102 is to disable various unused circuits within the RTU 102 when those circuits are not required or are not currently being used. For example, in some situations, the RTU 102 itself may be in an idle status. During this time, the RTU 102 is not acquiring any input signals or generating control signals. The RTU 102 may remain in this state until the control system 104 instructs the RTU 102 to begin performing some task(s). As a result, all functions in the RTU 102 could be disabled except for communication functions and basic processing functions, which significantly reduces power consumption by the RTU 102. In this mode, the processing device(s) 502 can be "asleep" and wake up occasionally to check for incoming data, and peripheral devices like memory and analog circuitry can be disabled. Moreover, certain communication ports can be disabled, such as when the Ethernet and RS232 ports 404-406 are disabled while the RS485 ports 408 remain active (since RS485 may consume less power compared with Ethernet and RS232 communications). In this ultra-low power mode, power consumption by the RTU 102 could be extremely low, and the RTU 102 can remain in this state until awakened by the control system 104.

As another example, in some installations, not all functions of the RTU 102 are utilized. For instance, there may be no analog inputs/outputs and no RS232 communications in a specific installation. In order to save power, the RTU 102 could disable all AI and AO circuits and the RS232 circuitry, such as by shutting down their external power supply. In this mode, the RTU 102 can automatically disable unused function blocks, such as based on a user's configuration and needs. Of course, if certain special cases of operations require some or all deactivated circuitry, that circuitry can be re-enabled as needed to support the desired functions.

A third example technique for reducing power consumption is shown in FIG. 10, which applies to analog input channels. Here, if the AI function is available and needed, the sample rates for the various AI channels can be identified, and data from multiple AI channels can be sampled within a very short "sampling" time. In between these sampling times, there can be long "idle" times during which the ADC circuits or other circuits associated with the AI channels are not used. If the interval between sampling periods is long enough, the processing device(s) 502 can elect to power down the AI circuits when idle, such as ADC chips and their associated operation amplifiers, to reduce power consumption and heat radiation. When the next sampling period occurs, the processing device(s) 502 can re-power and configure these components in a very short time and then sample the AI channels again. In some embodiments, this process can reduce power consumption associated with the AI channels by at least 50%.

Although FIGS. 9 and 10 illustrate one example of an electrical design for controlling operating characteristics of an RTU 102 and related details, various changes may be made to FIGS. 9 and 10. For example, the RTU 102 could operate using a single temperature sensor or more than two temperature sensors. Also, any other mechanism could be used to measure power consumption of the RTU 102. In addition, any other control algorithms could be used to reduce power consumption of an RTU 102 based on current, voltage, temperature, or other measurements associated with the RTU 102, and any suitable fixed or dynamic threshold values could be used with the control algorithms. For instance, a control algorithm could vary the frequency of components of the kernel board 418 linearly or nonlinearly based on temperature, input current, or other measurements.

Figure 11:
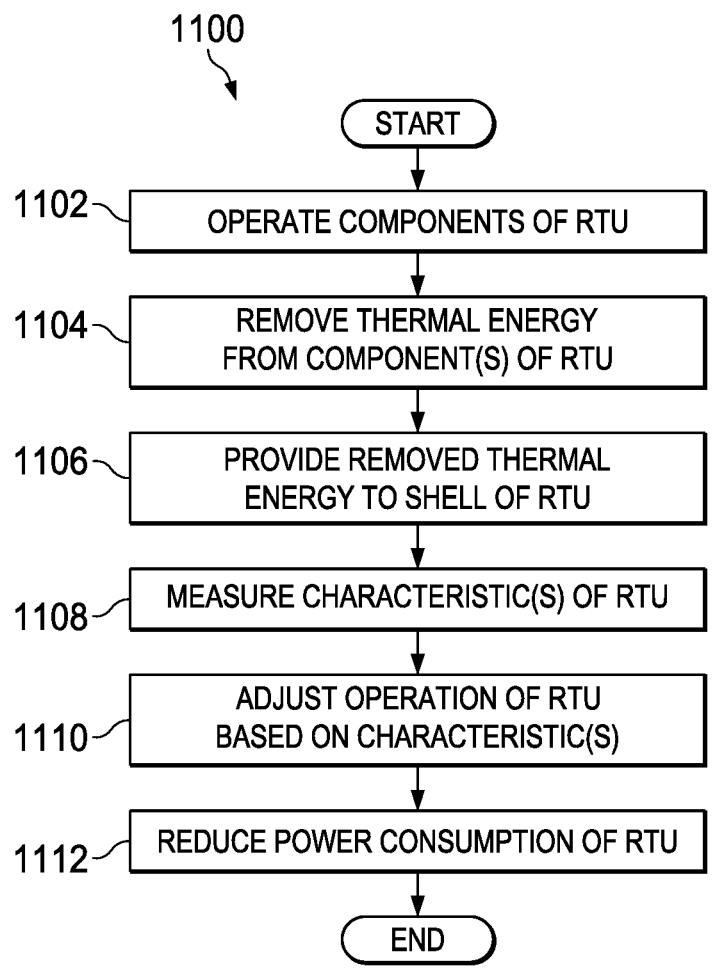
FIG. 11 illustrates an example method for supporting an elevated operating temperature and reduced power consumption of an RTU according to this disclosure.

FIG. 11 illustrates an example method 1100 for supporting an elevated operating temperature and reduced power consumption of an RTU according to this disclosure. As shown in FIG. 11, components of an RTU are operated at step 1102. This could include, for example, operating the boards 416-420 in the RTU 102 in order to receive input signals, analyze data, generate output signals, and communicate with external devices or systems. During this time, thermal energy is removed from one or more of these components at step 1104 and provided to a shell of the RTU at step 1106. This could include, for example, the heat sink 812 pulling heat from the processing device(s) 502 and providing the heat to the shell 804 via the thermal pad 814. As a result, thermal energy from the RTU 102 can be dissipated through the shell 804 of the RTU 102.

Moreover, during operation of the RTU, one or more characteristics of the RTU are measured at step 1108. This could include, for example, measuring the input current, enclosure temperature, or on-chip processor temperature of the RTU 102. The measurements are used to adjust operation of the RTU at step 1110, which helps to reduce power consumption by the RTU 102 at step 1112. As a result, thermal energy from the RTU 102 can be reduced since less power is being consumed by the RTU 102.

In this way, the RTU 102 can be used in more hostile environments, particularly those with elevated temperatures. The mechanical design of the RTU 102 can help to more effectively pull heat away from the processing device(s) 502 within the RTU 102, while the software/firmware control algorithms can be used to reduce power consumption by the RTU 102 (which also helps with thermal management in the RTU 102).

Although FIG. 11 illustrates one example of a method 1100 for supporting an elevated operating temperature and reduced power consumption of an RTU 102, various changes may be made to FIG. 11. For example, while shown as a series of steps, various steps in each figure could overlap, occur in parallel, occur in a different order, or occur any number of times.

In some embodiments, various functions described above are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

It may be advantageous to set forth definitions of certain words and phrases used throughout this patent document. The term "couple" and its derivatives refer to any direct or indirect communication between two or more elements, whether or not those elements are in physical contact with one another. The terms "application" and "program" refer to one or more computer programs, software components, sets of instructions, procedures, functions, objects, classes, instances, related data, or a portion thereof adapted for implementation in a suitable computer code (including source code, object code, or executable code). The terms "receive" and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
a remote terminal unit (RTU) comprising:
   a housing, at least a portion of the housing comprising a shell of thermally-conductive material;
   at least one circuit board assembly comprising at least one processing device configured to communicate with one or more industrial control and automation field devices via one or more input/output (I/O) channels, the at least one circuit board assembly positioned within the shell;
   a heat sink configured to remove thermal energy from the at least one processing device; and
   a thermal pad configured to receive the thermal energy from the heat sink and to provide the thermal energy to the shell;
wherein the at least one circuit board assembly comprises (i) a first circuit board assembly comprising the one or more I/O channels, (ii) a second circuit board assembly comprising the at least one processing device, and (iii) a third circuit board assembly configured to be physically connected to the first and second circuit board assemblies.

2. The apparatus of claim 1, wherein:
the first and second circuit board assemblies are located within and mounted to the shell; and
a cover of the shell has openings through which the first and second circuit board assemblies are physically connected to the third circuit board assembly.

3. The apparatus of claim 2, wherein:
the at least one processing device contacts the thermal pad when the second circuit board assembly is mounted within the shell; and
the thermal pad is deformable.

4. The apparatus of claim 1, wherein the RTU is configured to execute one or more control algorithms that are configured to reduce a power consumption of the RTU.

5. The apparatus of claim 4, wherein the one or more control algorithms are configured, to monitor one or more characteristics of the RTU and reduce the power consumption of the RTU in response to at least one of the one or more characteristics exceeding an associated threshold value.

6. The apparatus of claim 4, wherein the one or more control algorithms are configured to disable one or more circuits within the RTU.

7. The apparatus of claim 6, wherein the one or more control algorithms are configured to disable one or more components within analog input I/O channels during idle periods in between sampling periods during which data on the analog input I/O channels is sampled.

8. The apparatus of claim 1, wherein:
the first and second circuit board assemblies are connected to each other and are substantially parallel; and
the first and second circuit board assemblies are substantially perpendicular to the third circuit board assembly when physically connected to the third circuit board assembly.

9. A system comprising:
one or more industrial control and automation field devices; and
a remote terminal unit (RTU) comprising:
   a housing, at least a portion of the housing comprising a shell of thermally-conductive material;
   at least one circuit board assembly comprising at least one processing device configured to communicate with the one or more field devices via one or more input/output (I/O) channels, the at least one circuit board assembly positioned within the shell;
   a heat sink configured to remove thermal energy from the at least one processing device; and
   a thermal pad configured to receive the thermal energy from the heat sink and to provide the thermal energy to the shell;
wherein the at least one circuit board assembly comprises (i) a first circuit board assembly comprising the one or more I/O channels, (ii) a second circuit board assembly comprising the at least one processing device, and (iii) a third circuit board assembly configured to be physically connected to the first and second circuit board assemblies.

10. The system of claim 9, wherein:
the first and second circuit board assemblies are located within and mounted to the shell; and
a cover of the shell has openings through which the first and second circuit board assemblies are physically connected to the third circuit board assembly.

11. The system of claim 10, wherein:
the at least one processing device contacts the thermal pad when the second circuit board assembly is mounted within the shell; and
the thermal pad is deformable.

12. The system of claim 9, wherein the RTU is configured to execute one or more control algorithms that are configured to reduce a power consumption of the RTU.

13. The system of claim 12, wherein the one or more control algorithms are configured to monitor one or more characteristics of the RTU and reduce the power consumption of the RTU in response to at least one of the one or more characteristics exceeding an associated threshold value.

14. The system of claim 12, wherein the one or more control algorithms are configured to disable one or more circuits within the RTU.

15. The system of claim 14, wherein the one or more control algorithms are configured to disable one or more components within analog input I/O channels during idle periods in between sampling periods during which data on the analog input I/O channels is sampled.

16. The system of claim 9, wherein the one or more industrial control and automation field devices comprise:
at least one sensor; and
at least one actuator.

17. A method comprising:
operating at least one processing device on at least one circuit board assembly of a remote terminal unit (RTU), the at least one circuit board assembly positioned within a housing of the RTU, at least a portion of the housing comprising a shell of thermally-conductive material;

using the at least one processing device, communicating with one or more industrial control and automation field devices via one or more input/output (I/O) channels;

removing thermal energy from the at least one processing device using a heat sink; and receiving the thermal energy from the heat sink at a thermal pad and providing the thermal energy from the thermal pad to the shell;

wherein the at least one circuit board assembly comprises (i) a first circuit board assembly comprising the one or more I/O channels, (ii) a second circuit board assembly comprising the at least one processing device and (iii) a third circuit board assembly configured to be physically connected to the first and second circuit board assemblies.

18. The method of claim 17, wherein:

the first and second circuit board assemblies are located within and mounted to the shell; and a cover of the shell has openings through which the first and second circuit board assemblies are physically connected to the third circuit board assembly.

19. The method of claim 18, wherein:

the at least one processing device contacts the thermal pad when the second circuit board assembly is mounted within the shell; and the thermal pad is deformable.

20. The method of claim 17, further comprising:

executing one or more control algorithms to reduce a power consumption of the RTU, wherein at least one of:

the one or more control algorithms monitor one or more characteristics of the RTU and reduce the power consumption of the RTU in response to at least one of the one or more characteristics exceeding an associated threshold value; and the one or more Control algorithms disable one or more circuits within the RTU.

* * * * *